Figure 3:
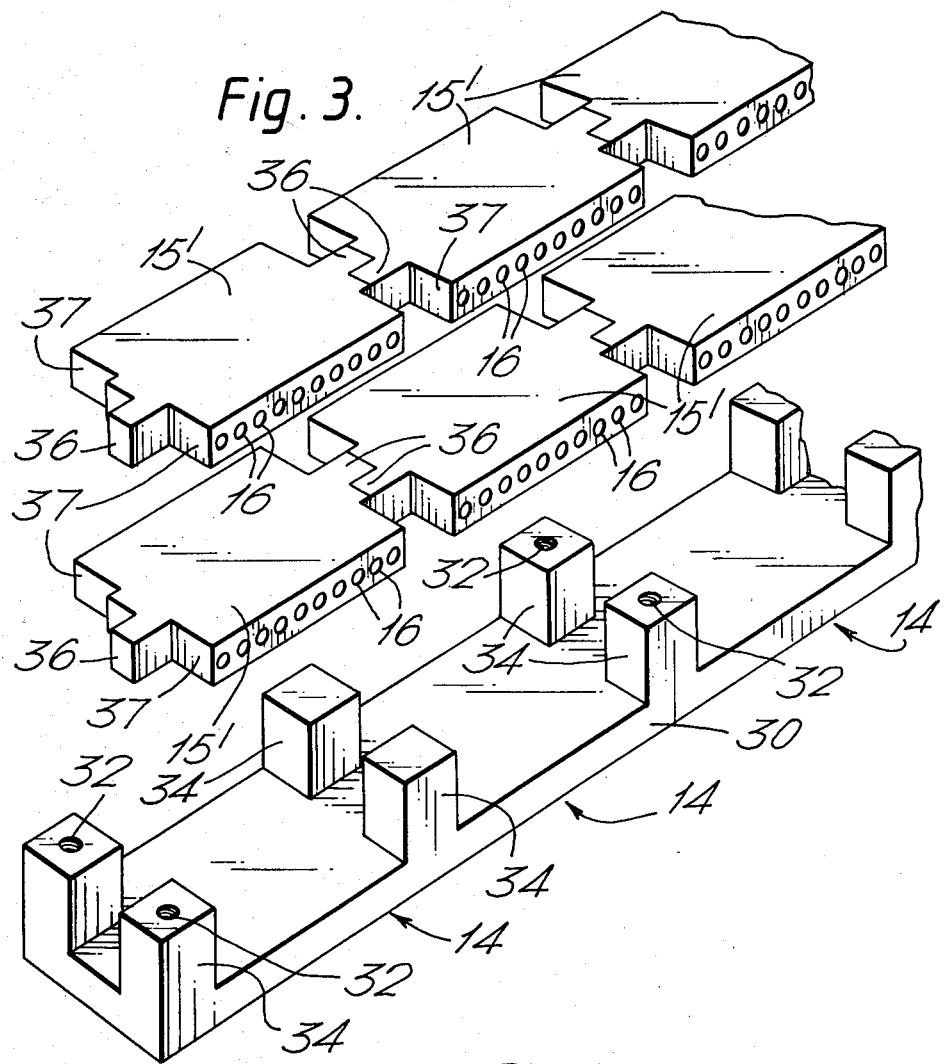

United States Patent [19]

Bell

[11] 4,366,527
[45] Dec. 28, 1982

[54] CIRCUIT ASSEMBLIES EACH WITH A CONNECTOR HAVING AN INSULATING BLOCK WITH TWO SEPARABLE STACKED PARTS

[75] Inventor: Melvyn R. Bell, Fife, Scotland

[73] Assignee: Ferranti Limited, Cheadle, England

[21] Appl. No.: 134,463

[22] Filed: Mar. 27, 1980

[30] Foreign Application Priority Data

Mar. 31, 1979 [GB] United Kingdom ............... 7911360

[51] Int. Cl.³ .............................................. H05K 7/20
[52] U.S. Cl. .................................. 361/386; 361/388; 361/428; 339/17 LC
[58] Field of Search .................. 357/75, 79, 81; 339/17 CF, 17 LC, 64 R, 112 R, 198 H, 206 R, 207 R, 208; 174/16 HS, 52 FP; 361/381–383, 386–389, 393, 400, 405, 413, 426, 428

[56] References Cited

U.S. PATENT DOCUMENTS

| | | | |
|---|---|---|---|
| 2,986,621 | 5/1961 | Midgley | 339/198 H |
| 3,641,474 | 2/1972 | Owens | 339/112 R |
| 3,702,456 | 11/1972 | Patton | 339/198 H |
| 3,899,719 | 8/1975 | Murphy | 361/405 |

Primary Examiner—G. P. Tolin
Attorney, Agent, or Firm—Kerkam, Stowell, Kondracki & Clarke

[57] ABSTRACT

A circuit assembly comprises a planar substrate 10 supporting, on a surface 11, connectors 14 and modules 12, each module having leads 13 extending from two opposing module surfaces, with the leads from one surface extending exclusively in one or two planes parallel to the module-bearing substrate surface, and with the leads from the other surface extending exclusively in the other such plane, the connectors each having an electrical insulating block 15 comprising two separable parts stacked one on the other, and rigidly secured to the substrate, and with connector pieces 17 secured to the block, such that there is facilitated, possible, at least partial, protection of connections between the module leads and the connector pieces, by the connections being on, or within, or adjacent to the block, before the module and the block are supported on the substrate.

7 Claims, 5 Drawing Figures

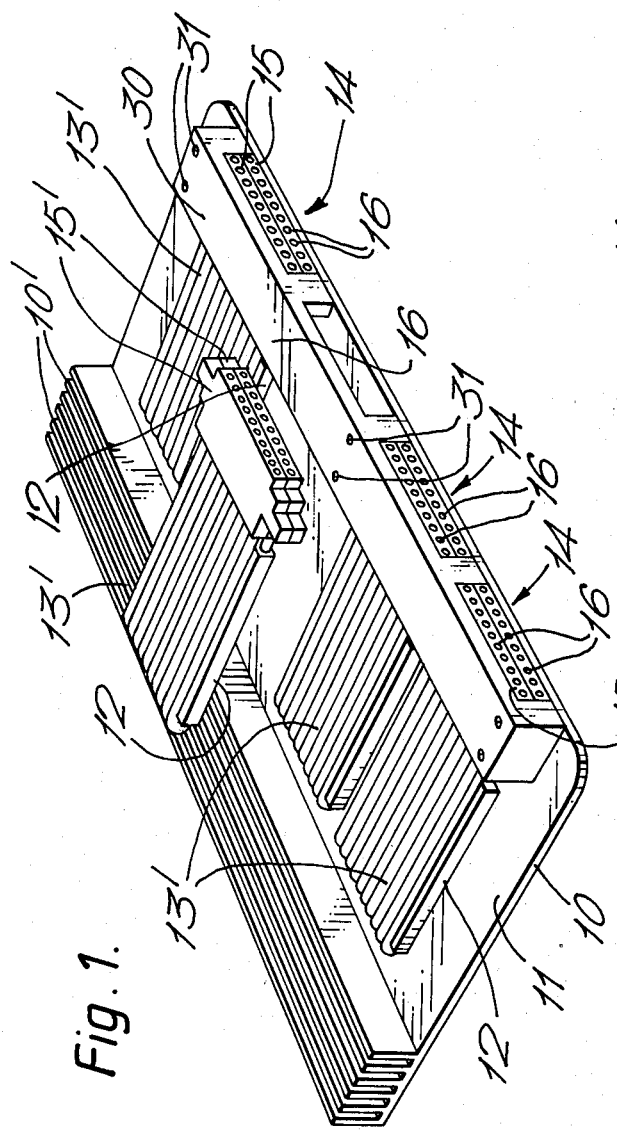
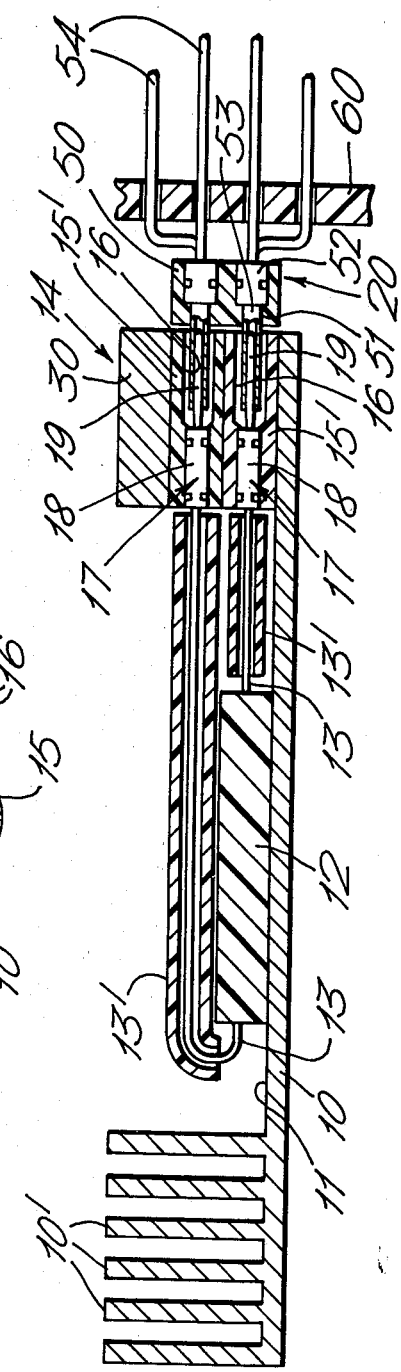

CIRCUIT ASSEMBLIES EACH WITH A CONNECTOR HAVING AN INSULATING BLOCK WITH TWO SEPARABLE STACKED PARTS

This invention relates to circuit assemblies, and in particular to circuit assemblies each having at least one component, comprising either a discrete component, or a module, with leads extending therefrom, and an at least substantially planar substrate upon which each constituent component is supported, possibly the at least substantially planar substrate comprising a heat sink.

In accordance with the main claim of our copending U.S. patent application Ser. No. 06/081,572 now continuation application Ser. No. 288,807, a circuit assembly comprises an at least substantially planar substrate, on at least one major surface of which substrate is supported at least one component with leads extending therefrom, and there is also supported on said one major surface of the substrate at least one connector having a plurality of electrically conducting connector pieces, each connector piece both cooperating with a lead of said at least one component, and providing a terminal of the circuit assembly, the plurality of connector pieces being secured to a block of electrical insulating material of the connector.

It is, in particular, to such a circuit assembly that the present invention relates, and in particular to such a circuit assembly in which said at least one component has leads extending from each of two opposing surfaces thereof. Usually, the connector extends along, and adjacent to, an edge of the substrate.

It is convenient, when more than one component is provided within the circuit assembly, to provide individually a connector for each constituent component or module, different connectors being provided for the different components or modules. For convenience, in this specification and the accompanying claims, a connector will be considered as being associated only with one component or module of the circuit assembly, unless otherwise appropriate.

Because both said at least one component or module, and the connector, are supported on the same major surface of the at least substantially planar substrate the location within the circuit assembly of said at least one component or module, and of the terminals of the circuit assembly, is facilitated. Thus, it is possible easily to provide the required electrical interconnections between the leads of said at least one module or component, and the terminals of the circuit assembly, without the necessity of including a printed circuit board within the circuit assembly.

In a circuit assembly according to the present invention, with the leads extending from two opposing surfaces of the module or component, the leads from one surface of the component or module exclusively may extend at least substantially in one of two planes parallel to said one major surface of the substrate, in which planes the leads extend, and leads extending from the two different surfaces of the component or module extend in two different planes parallel to said one major surface of the substrate. Each connector piece usually extends parallel to at least substantially the whole of the lead to which the connector piece is connected. Thus, the connector pieces extend parallel to each other, parallel to said one major surface of the substrate, and extend at right angles to at least one surface of the insulating block, an associated connector, possibly to cooperate, and mate, with the connector of the circuit assembly, to abut against said one surface of the insulating block, possibly, so that the circuit assembly can comprise part of a more complex circuit assembly. In addition, it is in particular to such a circuit assembly that the present invention relates.

It is an object of the present invention to provide such a circuit assembly of a form as described and claimed in our above-mentioned co-pending U.S. patent application, and of the form referred to in particular above, and the construction of the block of electrical insulating material of the connector is such that there is facilitated, possible, at least partial, protection of connections between the leads of the component, and the connector pieces of the connector, whilst the component, and the insulating block, are being supported on the substrate of the circuit assembly, by the connector pieces being secured to the block of electrical insulating material of the connector, and the connections being on, or within, or adjacent to the insulating block before the component, and the insulating block, are supported on the substrate of the circuit assembly.

According to the present invention a circuit assembly comprises an at least substantially planar substrate, on at least one major surface of which substrate is supported at least one component or module with leads extending therefrom, and there is also supported on at least one major surface of the substrate at least one connector connected to said at least one component or module, the connector having a plurality of electrically conducting connector pieces, each connector piece both co-operating with a lead of the component or module, and providing a terminal of the circuit assembly, the leads extend from two opposing surfaces of the module or component, and the leads from one surface of the component or module exclusively extend at least substantially in one of two planes parallel to said one major surface of the substrate, in which planes the leads extend, and leads extending from different surfaces of the component or module extend in different planes parallel to said one major surface of the substrate, the connector pieces extend parallel to each other, and parallel to said one major surface of the substrate, the connector pieces are secured to a block of electrical insulating material of the connector, and extend at right angles to at least one surface of the insulating block, the connections between the connector pieces and the leads are at least partially protected by the connections being on, or within, or adjacent to, the insulating block, and the block of insulating material is in two separable parts, the two separable block parts being stacked one on the other, and are rigidly secured to the substrate, within the completed circuit assembly, and the leads extending from one surface of the component or module are connected exclusively to the connector pieces secured to one of the two separable block parts, the leads extending from different surfaces of the component or module being connected to the connector pieces secured to different separable block parts.

By providing an insulating block comprising two separable parts, conveniently, the leads extending from one surface of the component or module can be secured to their associated connector pieces and to their associated separable part of the insulating block, and the leads extending from the other surface of the component or module conveniently can be secured to their associated connector pieces and to their associated separable part of the insulating block, before the component or module, and the insulating block, are supported on the substrate of the circuit assembly. Subsequently, and conveniently, the leads are bent into their relative positions required in the completed circuit assembly, with the two separable parts of the insulating block being stacked one on the other. In this form, the component or module, and the insulating block, together comprise a sub-assembly unit of the circuit assembly. The sub-assembly unit then is secured to the substrate to complete the circuit assembly. Hence, the connections between the connector pieces and the leads are at least partially protected whilst the component or module, and the insulating block are being secured to the substrate. The connector pieces may be secured to the separable parts of the insulating block either before, or after, the leads of the component or module are secured to the connector pieces.

Because the leads of said at least one module or component extend from two opposing surfaces of the module or component, and the leads from one surface of the component or module exclusively extend at least substantially in one of two planes parallel to said one major surface of the substrate, in which planes the leads extend, and leads extending from different surfaces of the component or module extend in different planes parallel to said one major surface of the substrate, and because the connector pieces extend parallel to each other, parallel to said one major surface of the substrate, and extend at right angles to at least one surface of the insulating block, it is possible for the two separable block parts to be stacked one on the other within the completed circuit assembly.

The separable block parts may be so shaped as to be interchangeable with each other.

The leads of said at least one component or module may extend along each of both opposing major surfaces of the substrate, and the two separable parts of the block of insulating material are supported one on each of the two opposing major surfaces of the substrate, the two separable parts of the block being stacked one on the other, and being secured together, within the completed circuit assembly, with the substrate intermediate therebetween. Hence, a single connector is considered to be on both major surfaces of the substrate.

Possibly an associated connector, for example, of a known form, is to co-operate, and mate, with the connector of the circuit assembly, and is to abut against another surface, than said one surface, of the insulating block, the connector pieces to extend at right angles to said other surface of the insulating block, said other surface being parallel to said one surface of the insulating block.

Either a common associated connector, or two associated connectors, may co-operate, and mate, with the two separable block parts of the connector. If two associated connectors are provided, each associated connector is to co-operate individually with a separable block part.

The insulating block may be secured to the substrate in any convenient way.

The leads of said at least one module or component may be secured to the connector pieces in any convenient manner.

The connector pieces may be secured to the block of insulating material of the connector in any convenient way.

Whilst each connector piece may have any convenient form, it may comprise a socket part integral with a spigot part, the socket part being connected to a lead of said at least one module or component, and the spigot part comprising a terminal of the circuit assembly.

The connector pieces may be secured within bores in the two separable parts of the insulating block.

More than one component or module may be connected to a connector, and/or more than one connector may be connected to a component or module, but as stated above, it is convenient, when more than one component or module is provided within the circuit assembly, to provide individually a connector for each constituent component or module. A plurality of electrical insulating blocks, for a plurality of connectors, each connector including an insulating block with two separable parts, may be provided within the circuit assembly. The plurality of electrical insulating blocks may be so shaped as to be interchangeable with each other. Either a common associated connector, or a plurality of associated connectors, may co-operate, and mate, with the plurality of connectors of the circuit assembly.

At least one insulating block, or insulating block part, may be provided on each of both opposing major surfaces of the substrate. Thus, the leads of said at least one component or module of the circuit assembly extend from two opposing surfaces of the component or module, and extend along each of both opposing major surfaces of the substrate; and/or at least one constituent module or component of the circuit assembly is provided on each of both opposing major surfaces of the substrate.

When a plurality of insulating blocks, or the parts of a plurality of insulating blocks, are provided on either major surface of the substrate, usually each connector so provided extending linearly along a linear edge of the substrate.

Said at least one component or module of the circuit assembly may be secured within the circuit assembly in any convenient manner. Desirably, the component or module is secured within the circuit assembly in a readily detachable manner, to facilitate the replacement of the module or component, for example, when faulty. Thus, said at least one component or module may be clamped to the substrated in a readily releasable manner. The insulating block also may be secured to the substrate in a readily detachable manner, for example, by being clamped thereto in a readily releasable manner, so that the insulating block may be replaced with the module or component. In addition, or alternatively, the connector pieces are secured to the insulating block in a readily detachable manner, for example by each being a press fit in a bore in the insulating block, the connector pieces possibly being replaceable with the module or component. Alternatively, the module or component is secured to the connector pieces in a readily detachable manner.

The at least substantially planar substrate of the circuit assembly may comprise a heat sink; or may be of electrical insulating material.

According to another aspect the present invention comprises the combination of a circuit assembly of any one of the forms referred to above, and at least one associated connector to co-operate, and mate, with the connector or connectors of the circuit assembly.

The, or each, associated connector may have a known form.

According to yet another aspect the present invention comprises the combination of at least one first circuit assembly, each first circuit assembly being of any one of the forms referred to above as a circuit assembly according to the present invention, and at least one second circuit assembly, the combination comprising a more complex circuit assembly than any constituent circuit assembly.

Each second circuit assembly may have at least one connector, comprising the associated connector referred to above, and to co-operate, and mate, with the connector or connectors of the first circuit assembly.

The required electrical interconnections between a plurality of constituent modules and/or components of a first circuit assembly may be provided by a second circuit assembly.

The circuit assembly according to the present invention and said second circuit assembly may be connected together in any convenient way to form a more complex circuit assembly than any constituent circuit assembly.

Said at least one second circuit assembly may at least include a pattern of conductors on an electrical insulating support, such as a printed circuit board.

At least one module or component of the more complex circuit assembly may be provided in said at least one second circuit assembly.

Said at least one second circuit assembly may be connected directly to the terminals of said at least one first circuit assembly, or a connector, comprising the associated connector referred to above, may be provided between each second circuit assembly and each co-operating first circuit assembly to be connected to the second circuit assembly, the associated connector possibly having a known form.

Figure 4:
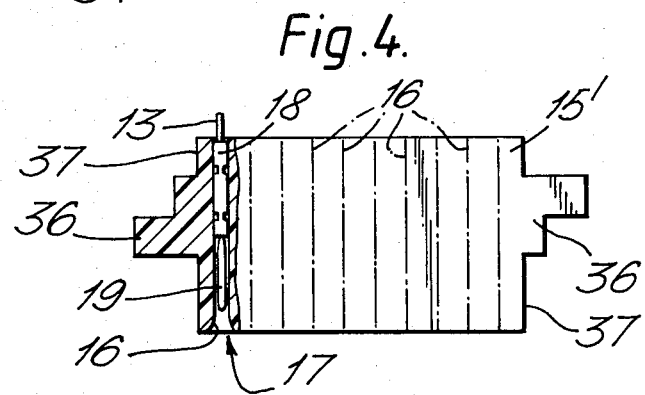
Figure 5:
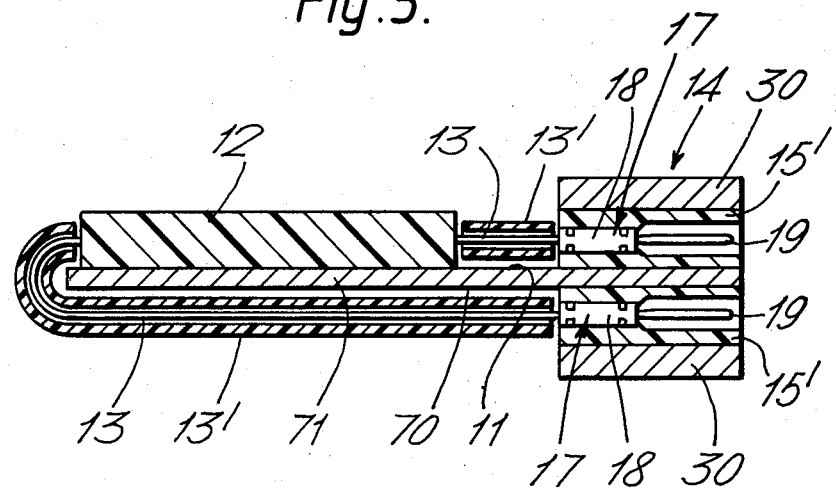

The present invention will now be described by way of example with reference to the accompanying drawings, in which:

FIG. 1 is a perspective view of a partially assembled circuit assembly comprising one embodiment in accordance with the present invention, the circuit assembly having four modules, and four connectors for the modules, supported on a major surface of an at least substantially planar substrate, FIG. 2 is a section of the circuit assembly of FIG. 1, comprising a first circuit assembly, together with both an associated connector co-operating with the connectors of the first circuit assembly, and part of a second circuit assembly, FIG. 3 is an exploded view of part of the arrangement of the four connectors of the first circuit assembly of FIGS. 1 and 2, the connectors being inverted in FIG. 3 in relation to their orientation in FIGS. 1 and 2, FIG. 4 is a, partially sectioned, plan view of a block of electrical insulating material of a connector of the first circuit assembly of FIGS. 1 to 3, the sectioned part of FIG. 4 showing an electrically conducting connector piece of the connector, and FIG. 5 corresponds to FIG. 2, but is of a circuit assembly having a single connector considered to be on both major surfaces of the substrate.

The circuit assembly shown in FIGS. 1 to 4 has a substantially planar substrate comprising a heat sink 10 of aluminium, the substrate being rectangular shaped in plan. Supported on one major surface 11 of the heat sink 10 are four, square shaped in plan, modules 12, each module 12 having a plurality of leads 13 (shown only in FIGS. 2 and 4), extending from each of two opposing surfaces of each module. As shown in FIGS. 1 and 2, the leads 13, individually, are covered by sleeves 13' of electrical insulating material. Four connectors 14, also comprising parts of the circuit assembly, are provided, the connectors extending along, and adjacent to, one edge of the major surface 11 of the heat sink 10. The leads 13 extend at least substantially in two parallel planes, these planes being parallel to the module-bearing surface 11 of the substrate 10.

In order to facilitate the extraction of heat from the heat sink 10, the heat sink is provided with fins 10', and so the heat sink is only substantially planar in form.

Each connector 14 includes a block 15 of electrical insulating material, in bores 16 in each of which blocks 15 are provided a plurality of electrically conducting connector pieces 17 (shown only in FIGS. 2 and 4), with a connector piece 17 individually in each bore 16. Each connector piece 17 has a socket part 18 to receive a module lead 13, and an integral spigot part 19, comprising a terminal of the circuit assembly, the terminal to co-operate with a socket of a connector 20, shown only in FIG. 2, to be associated with the circuit assembly, and to abut against one surface of the block. The associated connector 20 has a known construction.

Because both of the modules 12 and the connectors 14 are supported on the major surface 11 of the heat sink 10, the location within the circuit assembly of the modules 12, and of the integral spigot part 19, is facilitated. Thus, it is possible easily to provide a desired circuit assembly, and in particular to provide the required electrical interconnections between the modules 12 and the terminals 19, without the necessity of including a printed circuit board within the circuit assembly.

Each connector piece extends parallel to at least substantially the whole of the lead to which the connector piece is connected. Thus, the connector pieces extend parallel to each other, parallel to the major surface 11 of the substrate. The connector pieces also extend at right angles both to the surface of the insulating block, against which surface is to abut the associated connector 20, and to an opposing surface of the insulating block.

In fabricating the circuit assembly, initially the socket parts 18 of the connector pieces 17 of the connector 14 are secured to the leads 13 of the modules 12. Then the connector pieces 17 are secured within each block 15 of insulating material. Alternatively, in an unillustrated arrangement, the connector pieces 17 are secured to the block of insulating material before the connector pieces are secured to the module leads. With either such arrangement, the combination of the insulating block, and the module secured thereto, comprises a sub-assembly unit to be secured to the substrate 10 when completing the circuit assembly.

The socket part 18 of each connector piece 17 is arranged to be capable of being tightened around the co-operating module lead 13 before the connector piece 17 is inserted into its bore 16 in the block 15. Each socket part may not comprise a complete cylinder, but may comprise any convenient construction having at least one portion to be tightened around the co-operating module lead 13. The construction of the connector piece 17 as a whole is such that the connector piece is a press fit within the bore 16 of the block 15, after the connector piece has been secured to a module lead 13. Each connector piece 17 does not extend beyond the bore 16, and so is embedded within the block 15.

Each block of electrical insulating material is rigidly secured to the substrate by being clamped to the substrate by a bridging member 30 of the connector. The bridging member 30 is secured to the substrate by screws 31, the screws extending through bores 32 (shown in FIG. 3). The common bridging member spans each insulating block 15, and has four constituent parts, each such part individually spanning on insulating block. Each constituent part of the common bridging member 30 has four, square-shaped in section, legs 34, with a leg 34 at each corner of the portion of the bridging member part to span an insulating block of the connector, each leg extending normally to the spanning portion. Each adjacent constituent pair of parts of the common bridging member shares a common pair of legs, there being five pairs of legs provided for the four illustrated connectors. Each insulating block is a close fit between opposing surfaces of the two pairs of square shaped legs 34 of the connector including the insulating block.

Adjacent pairs of the electrical insulating blocks 15 co-operate with each other, in addition to co-operating with the common bridging member, and the shape of each of the insulating blocks is shown in detail in FIGS. 3 and 4. Thus, each block is provided with lugs 36, one by 36 being provided on either side surface 37 of the block extending parallel to the bores 16 for the connector pieces, and when the block is viewed in plan in the circuit assembly. The lugs 36, when so viewed in plan, are 'L'-shaped in section, and for each block, one arm of each lug is contiguous with the central part of the co-operating side surface of the block, and the lugs on the two side surfaces of the block are inverted. The arrangement is such that the lugs on two adjacent blocks within the circuit assembly are complementary with each other, and engage with each other, thereby the two adjacent blocks co-operating with each other.

The shape of the electrical insulating blocks is such that the blocks are interchangeable with each other within the circuit assembly.

The combination of the co-operating lugs of each adjacent pair of insulating blocks of the four connectors co-operate with the common bridging member, by being a close fit between opposing surfaces of the pair of square shaped legs of the bridging member common to the two connectors having the insulating blocks with the two co-operating lugs, in addition to each insulating block being a close fit between opposing surfaces of the two pairs of legs of the connector including the insulating block, and as referred to above.

The two outer pairs of legs of the common bridging member individually are a close fit for the outer lugs of the four co-operating insulating blocks, which outer lugs do not co-operate with any other lugs.

The bores 32, for the screws 31 securing the common bridging member to the substrate, extend through three spaced pairs of legs of the bridging member.

It is desirable that the arrangement is such that there is facilitated, possible, at least partial, protection of connections between the module leads and the connector pieces of the connector, whilst the module and the insulating block are being supported on the substrate of the circuit assembly, by the connector pieces being secured to the block of electrical insulating material of the connector, and the connections being on, or within, or adjacent to the insulating block, before the module and the insulating block are supported on the substrate of the circuit assembly. The obtaining of this criterion is facilitated by the block of insulating material being in two separable parts 15', as illustrated, the two separable block parts 15' being stacked one on the other, and the leads 13 extending from one surface of each module are connected exclusively to the connector pieces secured to one of the two associated separable block parts 15', the leads extending from different surfaces of the module being connected to the connector pieces secured to different separable block parts 15'.

By providing an insulating block comprising two separable parts, conveniently, the leads extending from one surface of each module can be secured to their associated connector pieces and to their associated separable part of the insulating block, and the leads extending from the other surface of the module conveniently can be secured to their associated connector pieces and to their associated separable part of the insulating block, before the module and the insulating block are supported on the substrate of the circuit assembly. Subsequently, and conveniently, the leads are bent into their relative positions required in the completed circuit assembly, with the two separable parts of the insulating block being stacked one on the other. In this form, the module and the insulating block together comprise a sub-assembly unit of the circuit assembly. The sub-assembly unit then is secured to the substrate to complete the circuit assembly. Hence, the connections between the connector pieces and the leads are at least partially protected whilst the module and the insulating block are being secured to the substrate. The connector pieces may be secured to the separable parts of the insulating block either before, or after, the leads of the module are secured to the connector pieces.

Because the leads of each module extend from two opposing surfaces of the module, and the leads from one surface of the module exclusively extent at least substantially in one of two planes parallel to said one major surface of the substrate, in which planes the leads extend, and leads extending from different surfaces of the module extend in different planes parallel to said one major surface of the substrate, and because the connector pieces extend parallel to each other, parallel to said one major surface of the substrate, and extend at right angles to at least one surface of the insulating block, said one block surface being parallel with the block surface to abut against the associated connector 20, it is possible for the two separable block parts to be stacked one on the other within the completed circuit assembly.

The two separable block parts may be so shaped as to be interchangeable with each other.

As shown in FIG. 2, the associated connector 20 comprises a block 50 of electrical insulating material, in bores 51 in which block 50 are provided a plurality of electrically conducting connector pieces 52, with a connector piece 52 individually in each bore 51. Each connector piece 52 has a socket part 53, shown partially cut-away in FIG. 2, and to co-operate with a spigot part 19 of a connector of the circuit assembly. For this purpose a portion of the socket part 53 extends beyond the associated bore 51. Within the bore 51 the socket part 53 is secured to a conductor 54 co-operating with a second circuit assembly, shown generally at 60. For convenience, in the illustrated arrangement, adjacent pairs of conductors 54 of the associated connector 20, whilst extending substantially wholly parallel to each other, are in four spaced parallel, planes, to facilitate making electrical contact therewith. The associated connector 20 is to abut against one surface of each insulating block 15 of the circuit assembly, each connector piece 17 secured to the insulating block extending at right angles to this surface of the insulating block.

Instead of providing a common associated connector, a plurality of associated connectors may co-operate, and mate, with the plurality of connectors 14. Further, in relation to each insulating block two associated connectors may be provided, each associated connector to co-operate individually with a separable block part.

With some such arrangements the modules of the circuit assembly according to the present invention may be replaceable, for example, when faulty, the connector pieces possibly being removed from the block 15 for this purpose. It is required that the modules are detachably secured to the substrate, for example, being clamped thereto in a readily releasable manner, as described and claimed in our co-pending U.S. patent application Ser. No. 134,464 or that the modules are not directly secured to the substrate. The securing of the insulating block to the substrate is in a readily detachable manner if the bridging member is secured to the substrate in a readily detachable manner.

Possibly the insulating block is replaced with the module. In addition, or alternatively, each module is secured to an insulating block in a readily detachable manner, possibly the connector pieces being secured to the insulating block in a readily detachable manner, to be replaced with the module or component, for example, the connector pieces, being a press fit within bores in the insulating block. Alternatively, each module is secured to the connector pieces in a readily detachable manner.

In another circuit assembly, as shown in FIG. 5, and in respect of which the same reference numerals are used in FIGS. 1 to 4 to identify the same or closely resembling parts, the leads 13 of the module 12 extend along each of both opposing major surfaces 11 and 70 of the substrate 71, and the two separable parts 15' of the block of insulating material are supported one on each of the two opposing major surfaces 11 and 70 of the substrate 71, each by a bridging member 30, the two separable parts of the block being considered as being stacked one on the other, and being secured together, with the substrate 71 intermediate therebetween. Hence, a single connector is considered to be on both major surfaces 11 and 70 of the substrate.

If a plurality of insulating blocks each with two separable block parts, are provided within the circuit assembly, the parts of the plurality of insulating blocks may be provided on either major surface of the substrate. The parts of the plurality of insulating blocks may be so shaped as to co-operate with each other.

At least one insulating block, or insulating block part may be provided on each of both opposing major surfaces of the substrate. Thus, the leads of said at least one module of the circuit assembly extend from two opposing surfaces, of the module, and extend along each of both opposing major surfaces of the substrate; and/or at least one constituent module of the circuit assembly is provided on each of both opposing major surfaces of the substrate.

The insulating blocks may be secured to the substrate in any convenient way.

At least one module of the illustrated circuit assembly may be omitted, and at least one discretely packaged component, possibly only having two leads extending therefrom, provided instead, there being at least one module or component provided in the circuit assembly.

It is not essential that all the connector pieces 17 of the provided connector 14 co-operate with modules or components. Thus, for example, one of the illustrated modules 12 may be omitted from the circuit assembly, or different modules have different numbers of leads.

More than one component or module may be connected to a connector, and/or more than one connector may be connected to a component or module.

The modules may have any convenient construction, and for example, comprise thin film modules of known forms.

Components, when provided, may comprise any known forms of components, such as resistors and capacitors.

The connector pieces 17 may be secured to the block 15 in any convenient way instead of being a press fit in bores therein.

The leads may be secured to the connector pieces in any convenient manner.

The connector pieces may have any convenient form. The connector pieces may not be substantially embedded in an insulating block, but instead the connector pieces may be at least partially exposed after being secured to the insulating block.

The at least substantially planar substrate may not comprise a heat sink, for example, being of electrical insulating material.

There may be only one module and one connector within the circuit assembly.

At least one first circuit assembly, comprising a circuit assembly referred to as a circuit assembly according to the present invention, and of any one of the forms described above, may be connected to at least one second circuit assembly 60, as shown in FIG. 2, to form a more complex circuit assembly than any constituent circuit assembly, the more complex circuit assembly being in accordance with another aspect of the present invention. Each second circuit assembly, possibly, has at least one connector, comprising the associated connector 20 referred to above, to co-operate, and mate, with the connector or connectors of the first circuit assembly, although co-operating first and second circuit assemblies may be connected together in any convenient way.

The required electrical interconnections between a plurality of constituent modules and/or components of a first circuit assembly may be provided by a second circuit assembly.

Said at least one second circuit assembly may at least include a pattern of conductors on an electrical insulating support, such as a printed circuit board.

At least one module or component of the more complex circuit assembly may be provided in said at least one second circuit assembly.

Any such arrangement is advantageous in that designing the construction of the more complex circuit assembly is facilitated; it is easy to remove a first circuit assembly with a faulty component or module; and it is possible to have a standard construction for each first circuit assembly, and perhaps also it is possible to have a standard construction for each second circuit assembly, for each of a plurality of different possible more complex circuit assemblies, each different possible first circuit assembly, and perhaps also each different possible second circuit assembly, respectively, varying from each other only in the form of, and/or in the number of, constituent modules and/or components, where appropriate.

What I claim is:

1. A circuit assembly comprising an at least substantially planar substrate, on at least one major surface of which substrate is supported at least one component with leads extending therefrom, and there is also supported on at least one major surface of the substrate at least one connector connected to said at least one component, the connector having a plurality of electrically conducting connector pieces, each connector piece both co-operating with a lead of the component and providing a terminal of the circuit assembly, the leads extend from two opposing surfaces of the component, and the leads from one surface of the component exclusively extend at least substantially in one of two planes parallel to said one major surface of the substrate, in which planes the leads extend, and leads extending from different surfaces of the component extend in different planes parallel to said one major surface of the substrate, the connector pieces extend parallel to each other, and parallel to said one major surface of the substrate, the connector pieces are secured to a block of electrical insulating material of the connector, and extend at right angles to at least one surface of the insulating block, the connections between the connector pieces and the leads are at least partially protected by the insulating block, and the block of insulating material is in two separable parts, the two separable block parts being stacked one on the other, and are rigidly secured to the substrate, within the completed circuit assembly, and the leads extending from one surface of the component are connected exclusively to the connector pieces secured to one of the two separable block parts, the leads extending from different surfaces of the component being connected to the connector pieces secured to different separable block parts.

2. A circuit assembly as claimed in claim 1 in which the separable block parts are so shaped as to be interchangeable with each other.

3. A circuit assembly as claimed in claim 1 in which the leads of said at least one component extend along each of both opposing major surfaces of the substrate, and the two separable parts of the block of insulating material are supported one on each of the two opposing major surfaces of the substrate, the two separable parts of the block being stacked one on the other, and being secured together, within the completed circuit assembly, with the substrate intermediate therebetween.

4. A circuit assembly as claimed in claim 1 in which the at least substantially planar substrate comprises a heat sink.

5. A circuit assembly as claimed in claim 1 in which the at least substantially planar substrate is of electrical insulating material.

6. A combination of a circuit assembly comprising an at least substantially planar substrate, on at least one major surface of which substrate is supported at least one component; with leads extending therefrom, and there is also supported on at least one major surface of the substrate at least one connector connected to said at least one component, the connector having a plurality of electrically conducting connector pieces, each connector piece both co-operating with a lead of the component, and providing a terminal of the circuit assembly, the leads extend from two opposing surfaces of the component, and the leads from one surface of the component exclusively extend at least substantially in one or two planes parallel to said one major surface of the substrate, in which planes the leads extend, and leads extending from different surfaces of the component extend in different planes parallel to said one major surface of the substrate, the connector pieces extend parallel to each other, and parallel to said one major surface of the substrate, the connector pieces are secured to a block of electrical insulating material of the connector, and extend at right angles to at least one surface of the insulating block, the connections between the connector pieces and the leads are at least partially protected by the insulating block, and the block of insulating material is in two separable parts, the two separable block parts being stacked one on the other, and are rigidly secured to the substrate, within the completed circuit assembly, and the leads extending from one surface of the component are connected exclusively to the connector pieces secured to one of the two separable block parts, the leads extending from different surfaces of the component being connected to the connector pieces secured to different separable block parts, the combination also including at least one connector to co-operate, and make, with said at least one connector of the circuit assembly.

7. A combination of at least one first circuit assembly, each first circuit assembly comprising an at least substantially planar substrate, on at least one major surface of which substrate is supported at least one component with leads extending therefrom, and there is also supported on at least one major surface of the substrate at least one connector connected to said at least one component, the connector having a plurality of electrically conducting connector pieces, each connector piece both co-operating with a lead of the component, and providing a terminal of the circuit assembly, the leads extend from two opposing surfaces of the component, and the leads from one surface of the component exclusively extend at least substantially in one of two planes parallel to said one major surface of the substrate, in which planes the leads extend, and leads extending from different surfaces of the component extend in different planes parallel to said one major surface of the substrate, the connector pieces extend parallel to each other, and parallel to said one major surface of the substrate, the connector pieces are secured to a block of electrical insulating material of the connector, and extend at right angles to at least one surface of the insulating block, the connections between the connector pieces and the leads are at least partially protected by the insulating block, and the block of insulating material is in two separable parts, the two separable block parts being stacked one on the other, and are rigidly secured to the substrate, within the completed circuit assembly, and the leads extending from one surface of the component, are connected exclusively to the connector pieces secured to one of the two separable block parts, the lead extending from different surfaces of the component being connected to the connector pieces secured to different separable block parts, the combination also including at least one second circuit assembly, the combination comprising a more complex circuit assembly than any constituent circuit assembly.

* * * * *

UNITED STATES PATENT AND TRADEMARK OFFICE
CERTIFICATE OF CORRECTION

PATENT NO. : 4,366,527
DATED : December 28, 1982
INVENTOR(S) : Melvyn R. BELL

It is certified that error appears in the above-identified patent and that said Letters Patent are hereby corrected as shown below:

Claim 6, line 24 of Column 12, "make" should be -- mate --;

Claim 7, line 58 of Column 12, "lead" should be -- leads --.

Signed and Sealed this

Twenty-ninth Day of March 1983

[SEAL]

Attest:

GERALD J. MOSSINGHOFF

Attesting Officer    Commissioner of Patents and Trademarks